United States Patent [19]
Bläsing et al.

[11] Patent Number: 4,783,244
[45] Date of Patent: Nov. 8, 1988

[54] METHOD OF AND DEVICE FOR GUIDING PLATE-SHAPED OBJECTS

[75] Inventors: Horst Bläsing, Berlin; Thomas Kosikowski, Nürnberg; Ludwig Mankut, Altdorf; Walter Meyer, Berlin, all of Fed. Rep. of Germany

[73] Assignee: Schering Aktiengesellschaft, Berlin and Bergkamen, Fed. Rep. of Germany

[21] Appl. No.: 99,764

[22] Filed: Sep. 22, 1987

[30] Foreign Application Priority Data

Sep. 24, 1986 [DE] Fed. Rep. of Germany ....... 3632378

[51] Int. Cl.$^4$ .................. C25D 7/00; C25D 17/00
[52] U.S. Cl. ..................................... 204/27; 204/198
[58] Field of Search ................. 204/198, 202, 27

[56] References Cited

U.S. PATENT DOCUMENTS 4,576,685 3/1986 Goffredo ...................... 204/198

Primary Examiner—T. M. Tufariello
Attorney, Agent, or Firm—Michael J. Striker

[57] ABSTRACT

A device for guiding plate-shaped objects to be electroplated through an electro-plating bath in a container, includes a device transporting said objects to the container in a horizontal position, a device for pivoting the objects in the bath from a horizontal position about a horizontal axis so that the objects assume a position below the mirror of the bath. The pivoting device guides the objects through the container and, at the outlet thereof, pivots the objects back to the horizontal position.

8 Claims, 3 Drawing Sheets

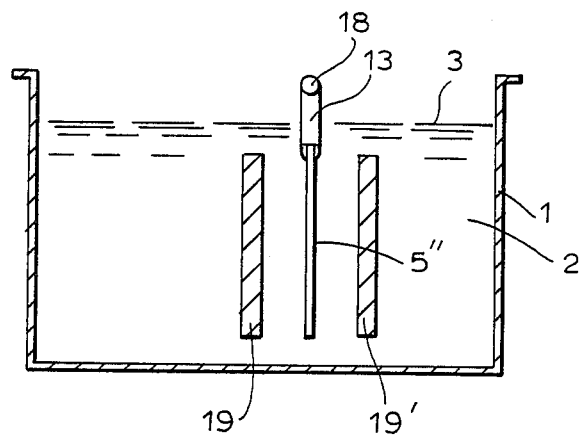
F I G. 3
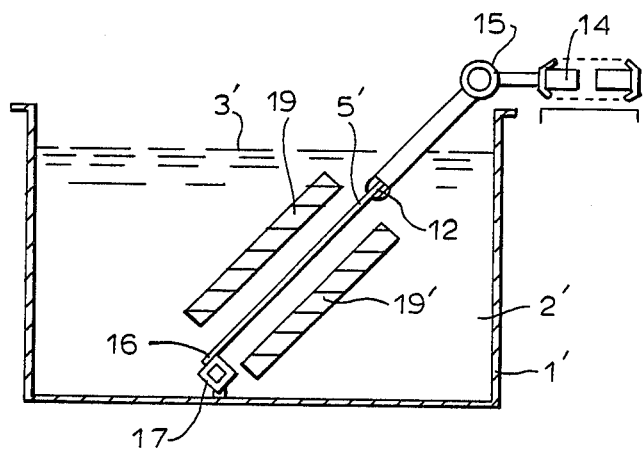
F I G. 4

METHOD OF AND DEVICE FOR GUIDING PLATE-SHAPED OBJECTS

BACKGROUND OF THE INVENTION

The present invention relates to a method of and a device for guiding plate-shaped objects such as printed circuit boards through the container filled with an electro-plating bath.

Such devices and methods are known and serve for galvanizing printing circuit boards utilized in electronics, in electro-plating containers, with copper or other metals. Such a device has been disclosed, for example, in DE-OS No. 32 36545. In this conventional device, objects being electro-plated are guided through the container filled with the electrolysis liquid in the horizontal position. Inasmuch as the plate-shaped objects must be located in the electrolysis bath in the container during the electro-plating process and take the aforementioned horizontal position the problem arises that the sizes of inlet and outlet openings in the container for the objects being treated therein must ensure, on the one hand, the passage of the objects therethrough. On the other hand, the mirror of the electrolytic liquid in the container must be higher than the position of these through openings for the objects being electro-plated because otherwise the galvanizing process cannot be executed. The problem which occurs in this case resides in that these passage openings must be sealed against the electrolytic liquid or means must be provided to ensure that all leaked liquid be returned into the bath. Such arrangements are quite expensive but must be provided because the horizontal transportation of the objects being electroplated to the container and from the container is also important when these objects must be treated in the horizontal position before they enter the container and/or after they exit from the container.

SUMMARY OF THE INVENTION

It is an object of the present invention to provide an improved method of and an improved device for guiding plate-shaped objects through the electro-plating bath of the electrolysis container.

It is another object of the invention to provide a device in which the transport of the plate-shaped objects to and from the electro-plating container in the horizontal position would be ensured while the problem of the occurrence of the leakage of the electrolytic liquid from the container is solved.

These and other objects of the invention are attained by a method of guiding plate-shaped objects to be electro-plated through an electro-plating bath in a container, comprising the steps of transporting said objects to the container in a horizontal position, pivoting said objects in said bath from a horizontal position about a horizontal axis extending in a direction of transporting so that said objects assume a position at least below a mirror of said bath, then transporting said objects through an electrolysis region in said bath, then pivoting said objects back to the horizontal position and transporting said objects in said horizontal position from the container.

The plate-shaped objects are immersed in the electro-plating bath in the assumed position which is non-horizontal but inclined or vertical. The objects in that assumed position are thus located below the level of the mirror of the electro-plating bath and below the level at which they were transported towards the bath in horizontal position whereby it is insured that during the electro-plating process the plate-shaped objects are completely immersed in the bath.

The objects of this invention are also attained by a device for guiding plate-shaped objects to be electro-plated through an electro-plating bath, comprising container means containing said bath and having an inlet opening and an outlet opening; means for transporting the objects to said container in a horizontal position; and pivoting means for pivoting said objects about a horizontal axis extending in a direction of transport from said horizontal position so that said objects assume a position at least below a mirror of said bath which is below said inlet and outlet opening; said pivoting means at said outlet opening pivoting said objects back to the horizontal position.

The pivoting means may be formed so as to hold said objects transport the same through said container means; and further including transport means applied to said pivoting means to transport said pivoting means holding said objects through said container means.

The pivoting means or devices can be interchangeable or can be made so long as to allow the plate-shaped objects to be positioned at least below the mirror of the galvanizing liquid so that all the faces to be galvanized are located inside the electro-plating liquid and the mirror of the liquid could lie deeper.

The pivoting about the horizontal axis is attained by very simple means and also facilitates the accommodation of the anodes in the electro-plating bath.

The means for transporting said objects from said container means in a horizontal position may be provided, said means for transporting said objects to said container and said means for transporting said objects from said container may be transport rollers.

According to a further modification of the invention, the device may further include a guiding rail position in said container means and supporting lower sides of said objects when said objects are in said assumed position held and transported by said pivoting means through said container means. The pivoting means is formed so as to hold said objects in said assumed position at least vertically and inclined. The inclined position of the objects being galvanized is specifically advantageous when a space in the galvanizing bath for accommodating the objects in the vertical position is relatively narrow. The plates being galvanized slide at their lower sides along the guiding rail during the transport in the container. The guide rail partially takes up the weight of the objects being galvanized. Furthermore, the oscillating motion of the objects transported in the bath is prevented.

The anodes provided in said container means may be positioned at two sides of said objects when the latter are in said assumed position.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWING

FIG. 3 is a sectional view on line III—III of FIG. 2; and

FIG. 4 is a sectional view similar to that of FIG. 3 but of a second embodiment of the invention.

DETAILED DESCRIPTION OF THE PREFERRED EMBODIMENTS

Figure 1:
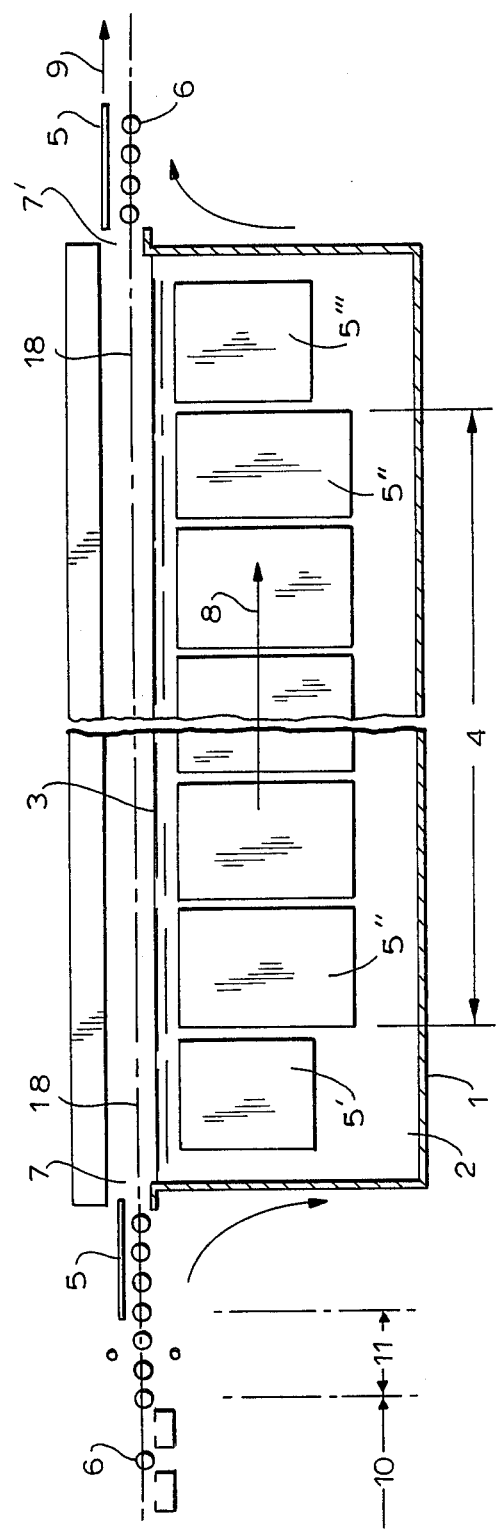
FIG. 1 is a schematic side view of the device for guiding plate-shaped objects of the first embodiment of the invention.
Figure 2:
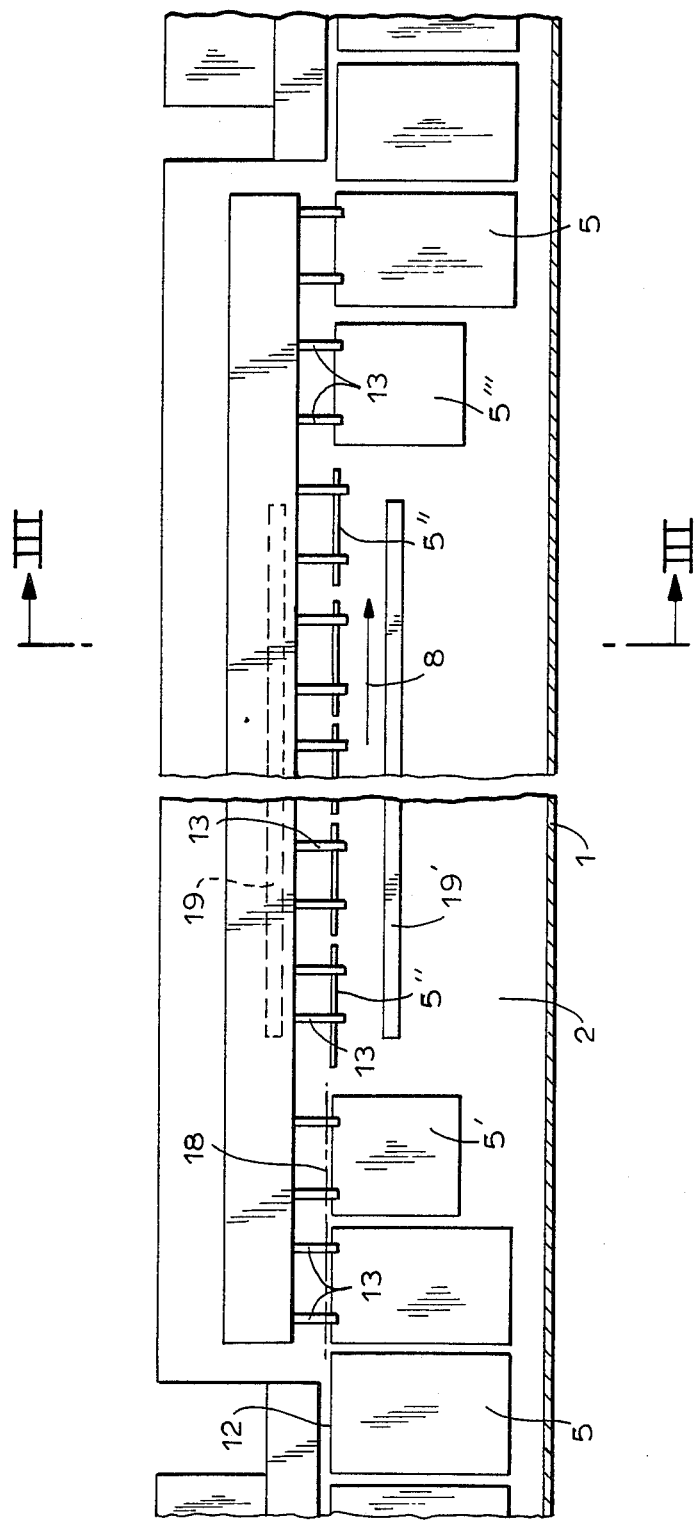
FIG. 2 is a schematic top plan view of the device of FIG. 1.

Referring now to the drawings in detail it will be seen that reference numeral 1 designates a container with an electrolytic bath 2. Current supply means widely known in such devices are not shown. The electrolysis or anode area, also called a bath area, is denoted at 4.

The plate-shaped objects which are to be galvanically metallized or electro-plated are preferably printed circuit boards 5 utilized in electronics. These objects 5 are transported in the horizontal position from the left to the right in the plane of the drawing by means of rollers 6 to enter a slot-shaped opening 7 extending horizontally and formed in the container 1. Upon entering the container the plate-shaped objects 5 are tilted or pivoted from the horizontal position about the horizontal axis 18 extending in the direction of transportation 8, 9 and take their final vertical position designated at 5" after they pass their intermediate inclined position 5'. In the vertical position 5", the plate-shaped objects, e.g. printed circuit boards pass through the anode area 4 in the direction of arrow 8 and are then again pivoted about the horizontal axis 18 via the inclined positon 5" to the horizontal position and leave the container 1 in this horizontal position through a discharge slot 7' in the direction of arrow 9.

As shown in FIG. 3 the plate-shaped objects can in the vertical position 5" be utilized to provide space for accommodating of anodes 19 so that the dimensions of the container 1 would not be enlarged for this purpose. As can be further seen in the drawings the plate-shaped objects in the vertical position 5" in the electro-plating phase which is defined by the anode region 4, are positioned below the liquid mirror 3 of the electro-plating bath 2. Mirror 3 of the liquid in the bath 3 is positioned below the inlet and output openings 7, 7' for the plates or objects 5 moved in the horizontal position.

While the plate-shaped objects are transported by rollers 6 or any other suitable transporting means from the pre-treatment region and after-treatment region such as a chemical treatment area 10 and rinsing area 11 to the container 1, gripping means, for example schematically shown tongues 13, provided in the container 1 grip the plate-shaped objects at the side 12 (FIG. 4) and simultaneously transport them in the direction of arrow 8. Pivoting device which turn the plate-shaped objects from the horizontal position 5 to the intermediate position 5' or the vetical position 5" and from the vertical position 5" via intermediate position 5' to the final end position are provided either at the free ends of holding means 13 or mounted in the container 1 in the region of axis 18. Such pivoting devices must be provided at least in the inlet and outlet regions of the container 1 whereas for transporting the objects in the anode area 4 other means can be provided which also would serve for electric current supply. The pivoting, transporting and current supply functions can be performed by the means combined into a single unit.

With reference to FIG. 4 it will be seen that container 1' is filled with electrolysis liquid of bath 2 having mirror 3'. The plate-shaped objects 5' are shown in their inclined position in the anode region and are connected to a transport device 14 which has a pivoting device 15. The electro-plating process is executed in this inclined position of the plates 5' whereby the lower ends 16 of the plates slide on a guide rail 17 which extends at least through the anode region. Reference numerals 19, 19' designate anodes which are positioned at both sides of the objects being galvanized, similarly to the embodiment of FIG. 3, so that a space-saving arrangement results.

It will be understood that each of the elements described above, or two or more together, may also find a useful application in other types of methods and devices for guiding plate-shaped objects in electrolysis baths differing from the types described above.

While the invention has been illustrated and described as embodied in a method and device for guiding plate-shaped objects in an electrolysis bath, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of guiding plate-shaped objects each having wide surface sides to be electro-plated and narrow sides, through an electro-plating bath in a container from an inlet to an outlet of said container, comprising the steps of transporting said objects to the inlet of said container in a horizontal position, pivoting said objects in said container from a horizontal position about a horizontal axis extending along a direction of transporting of said objects from said inlet to said outlet so that said objects assume a position at least below a mirror of said bath and are positioned in said bath side by side with narrow sides of neighboring objects facing each other, then transporting said objects through an electrolysis region in said bath, then pivoting said objects back to the horizontal position and transporting said objects in said horizontal position from the container.

2. A device for guiding plate-shaped objects each having wide surface sides to be electro-plated and narrow sides through an electro-plating bath, comprising container means containing said bath and having an inlet opening; means for transporting the objects to said inlet opening of said container in a horizontal position; and pivoting means for pivoting objects about a horizontal axis extending along a direction of transporting of said objects from said inlet opening to said outlet opening from said horizontal position so that said objects assume a position at least below a mirror of said bath which is below said inlet and outlet opening and said objects are positioned in said bath side by side with narrow sides of neighboring objects facing each other; said pivoting means at said outlet opening pivoting said objects back to the horizontal position.

3. The device as defined in claim 2, wherein said pivoting means are formed so as to hold said objects to transport the same through said container means; and further including transport means applied to said pivoting means to transport said pivoting means holding said objects through said container means.

4. The device as defined in claim 3, wherein means for transporting said objects from said container means in a horizontal position is provided, said means for transporting said objects to said container, and said means for transporting said objects from said container being transport rollers.

5. The device as defined in claim 4, further including a guiding rail positioned in said container means and supporting lower sides of said objects when said objects are in said assumed position held and transported by said pivoting means through said container means.

6. The device as defined in claim 5, wherein said pivoting means is formed so as to hold said objects in said assumed position vertically.

7. The device as defined in claim 5, wherein anodes provided in said container means are positioned at two sides of said objects when the latter are in said assumed position.

8. The device as defined in claim 5, wherein said pivoting means is formed so as to hold said objects in said assumed position inclined relative to said axis.

* * * * *